United States Patent [19]
Ovens

[11] Patent Number: 5,338,980
[45] Date of Patent: Aug. 16, 1994

[54] CIRCUIT FOR PROVIDING A HIGH-SPEED LOGIC TRANSITION

[75] Inventor: Kevin M. Ovens, Garland, Tex.

[73] Assignee: Texas Instruments Incorporated, Dallas, Tex.

[21] Appl. No.: 985,734

[22] Filed: Dec. 4, 1992

Related U.S. Application Data

[63] Continuation of Ser. No. 908,763, Jul. 1, 1992, abandoned, which is a continuation of Ser. No. 851,229, Mar. 12, 1992, abandoned, which is a continuation of Ser. No. 417,979, Oct. 4, 1989, abandoned.

[51] Int. Cl.$^5$ ............... H03K 19/086; H03K 17/60; H03K 17/16; H03K 5/12
[52] U.S. Cl. ..................... 307/455; 307/467; 307/443; 307/255; 307/263
[58] Field of Search ............ 307/255, 315, 455, 467, 307/494, 254, 280, 319, 292, 273, 263, 300, 246, 443, 270; 330/252

[56] References Cited

U.S. PATENT DOCUMENTS

| | | | |
|---|---|---|---|
| 3,471,719 | 10/1969 | Hughes | 307/246 |
| 3,678,291 | 7/1972 | Coe | 307/315 |
| 3,700,929 | 10/1972 | Frederiksen | 307/292 |
| 4,461,960 | 7/1984 | Yasunaga | 307/255 |
| 4,734,595 | 3/1988 | Le Roux et al. | 307/315 |
| 4,847,515 | 7/1989 | Nakach et al. | 307/315 |
| 4,945,259 | 7/1990 | Anderson | 307/270 |

*Primary Examiner*—Timothy P. Callahan
*Assistant Examiner*—Trong Phan
*Attorney, Agent, or Firm*—Thomas G. Eschweiler; James C. Kesterson; Richard L. Donaldson

[57] ABSTRACT

An ECL gate (32) includes a speedup circuit (34) comprising an NPN transistor (36) having its base connected to the IN signal to the gate (32). The PNP transistor drives an NPN transistor (40) to provide faster output transitions responsive to low-to-high transition to the IN signal.

15 Claims, 1 Drawing Sheet

CIRCUIT FOR PROVIDING A HIGH-SPEED LOGIC TRANSITION

This application is a continuation of prior application Ser. No. 07/908,763, filed on Jul. 1, 1992, now abandoned, which is a continuation of prior application Ser. No. 07/851,229, filed on Mar. 12, 1992, now abandoned, which is a continuation of prior application Ser. No. 07/417,979, filed on Oct. 4, 1989, now abandoned.

TECHNICAL FIELD OF THE INVENTION

This invention relates in general to integrated circuits, and more particularly to a circuit which provides a fast output transition responsive to a input transition.

BACKGROUND OF THE INVENTION

In integrated circuit design, great emphasis is placed on the operating speed of a circuit. For high-speed applications, emitter coupled logic (ECL) technology is often used because of its speed advantage over transistor-transistor logic (TTL) technology.

In its simplest form, an ECL gate comprises a differential pair of NPN transistors, the first transistor having its base connected to an input and the second transistor having its base connected to a reference voltage. If the input voltage is greater than the reference voltage, the collector voltage of the first transistor decreases and the collector voltage of the second transistor increases. If the input voltage is less than the reference voltage, the collector voltage of the first transistor increases and the voltage at the collector of the second transistor decreases. Hence, the voltage on the collector of the second transistor follows the voltage of the input signal and the voltage at the collector of the first transistor follows the complement of the input signal.

The common emitter differential pair, while faster than TTL logic, is still slower than other transistor structures, such as emitter followers. In fact, emitter followers are often connected to the collectors of the differential pair to allow the circuit to drive a larger load. Typically, the addition of emitter follower transistors will add a delay of about 20–30% to the circuit.

Circuitry for increasing the output transition speed of the complement output in response to a low-to-high transition of the input is described in U.S. patent application Ser. No. 302,063, entitled "Active Load for ECL Type Outputs", to Ovens, filed on Jan. 24, 1989, which is incorporated by reference herein. In designing a circuit, however, the worst case specifications must be considered; therefore, to increase the operating speed of the ECL gate, the output transistor speed of the "true" output of the ECL gate must also be increased.

Therefore, a need has arisen to provide a circuit for providing a fast output transition of the true output in response to a low-to-high transition of the input signal.

SUMMARY OF THE INVENTION

In accordance with the present invention, a high-speed output circuit responsive to a low-to-high input transition is provided which substantially increases the operating speed of a logic gate.

In a first aspect of the present invention, a circuit is provided which produces a fast output transition from a low logic state to a high logic state responsive to an input transition from a low logic state to a high logic state. The circuit includes a capacitive element operable to store charge while the input is in a low logic state. In the preferred embodiment, the capacitive element comprises the base emitter junction of a PNP transistor. Upon the transition at the input from a low logic state to a high logic state, the voltage at the emitter of the PNP transistor is increased, thereby enabling a switching element to generate a high logic state at the output of the circuit. Typically, the switching element comprises an NPN transistor whose base is driven by the emitter of the PNP transistor. When enabled, the NPN transistor conducts between a predetermined voltage representing the high logic state, typically ground, and the output node of the circuit.

The high-speed transition circuit of the present invention may be placed in parallel with a typical ECL gate to provide a faster output transition for the true output responsive to a low-to-high transition of the input signal. Hence, the circuit of the present invention provides a faster operating speed for an ECL gate, while only adding a few elements to the design of the gate.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
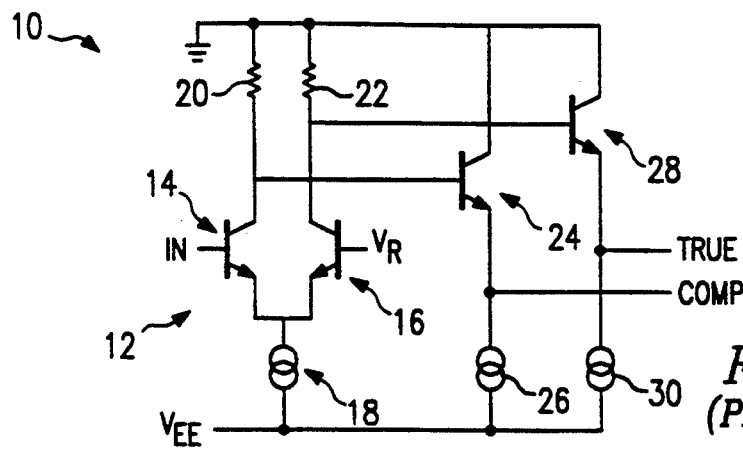
FIG. 1 illustrates a schematic representation of a prior art ECL circuit.
Figure 2:
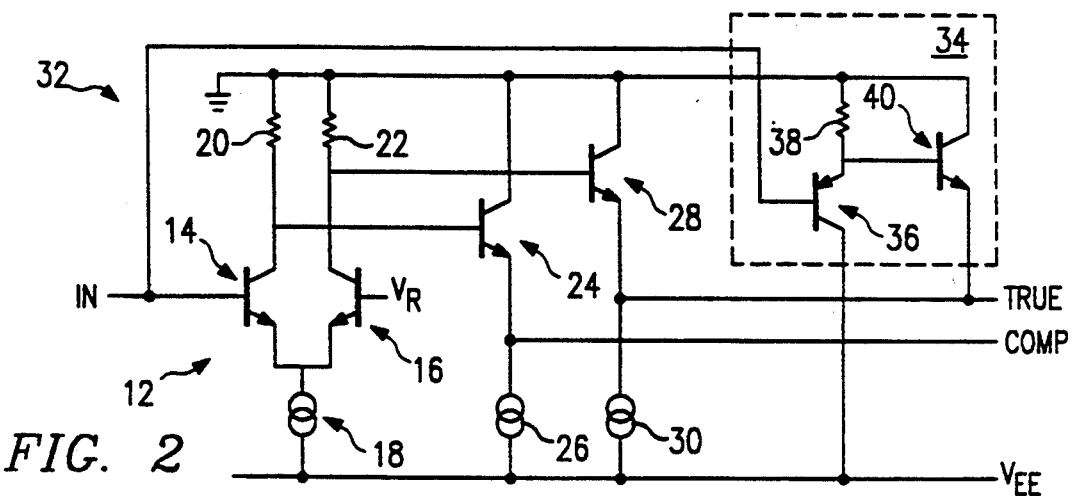
FIG. 2 illustrates a schematic representation of an ECL gate using the output transition circuit of the present invention.
Figure 3:
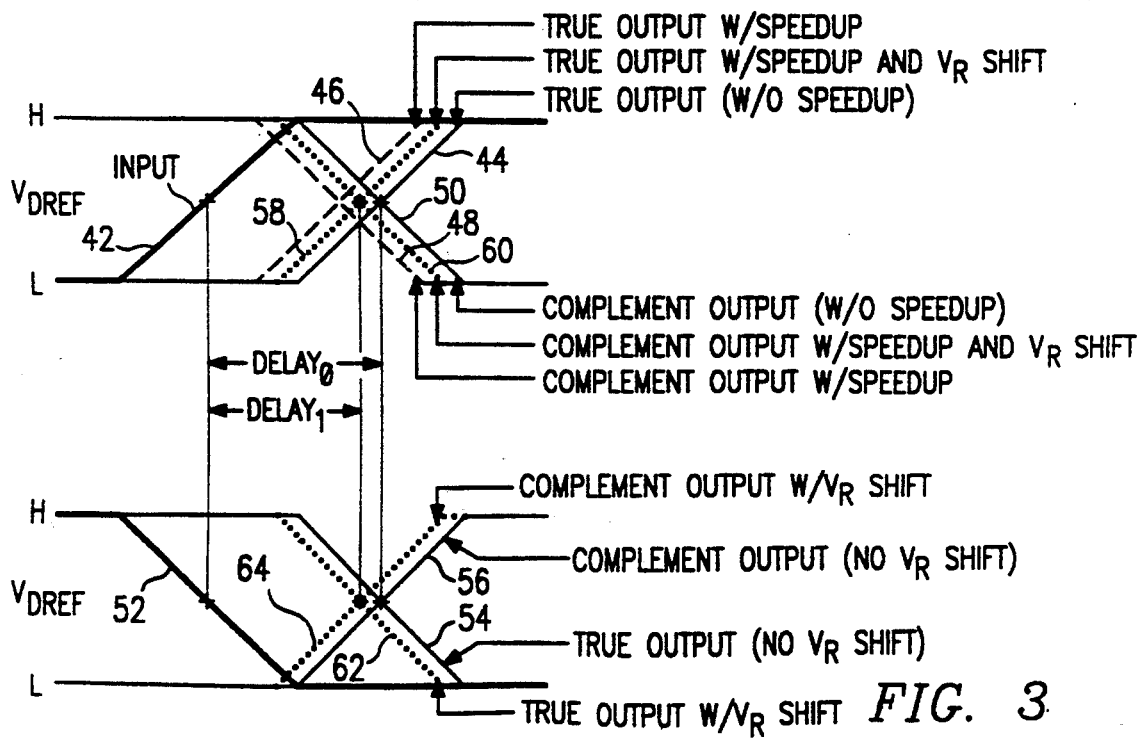
FIG. 3 illustrates a graphical depiction of how the output transition circuit of the present invention may be used in conjunction with a circuit for increasing the speed of the complement output of the ECL gate responsive to a low-to-high transition of the input signal in order to increase the operating speed of the circuit for worst case conditions.

The preferred embodiment of the present invention is best understood by referring to FIGS. 1–3 of the drawings, like numerals being used for like and corresponding parts of the various drawings.

FIG. 1 illustrates a schematic representation of a prior art ECL gate, generally referred to by reference numeral 10. The ECL gate illustrated in FIG. 1 receives an input signal IN and produces two output signals TRUE and COMP. The TRUE signal tracks the IN signal, and the COMP signal tracks the complement of the IN signal. Hence, in a low-to-high transition of the IN signal, the TRUE signal will transition from low-to-high and the COMP signal will transition from high-to-low. It is understood that more complex logic gates can be formed using ECL technology, and that the ECL gate 10 illustrated in FIG. 1 is just one example thereof.

The ECL gate 10 comprises a differential pair 12 comprising two NPN transistors 14 and 16. The IN signal is connected to the base of the NPN transistor 14 and a voltage reference, $V_R$, is connected to the base of NPN transistor 16. The emitters of the NPN transistors 14 and 16 are connected to $V_{EE}$ through current source 18. $V_{EE}$ is typically set to a voltage of −5.2v. The collector of NPN transistor 14 is connected to ground through resistor 20. The collector of NPN transistor 16 is similarly connected to ground through resistor 22. The collector of NPN transistor 14 is also connected to the base of an NPN transistor 24, which has a collector connected to ground and an emitter connected to $V_{EE}$ through current source 26. The collector of NPN transistor 16 is connected to the base of an NPN transistor 28 which has a collector connected to ground and an emitter connected to $V_{EE}$ through current source 30. The TRUE output is taken from the emitter of NPN transistor 28 and the COMP output is taken from the emitter of NPN transistor 24.

In operation, the differential pair produces logic signals on the collectors of the NPN transistors and 16 responsive to the difference between the IN signal and $V_R$. Typically, $V_R$ is set at a voltage half way between the desired high and low logic states. Hence, if the high logic level is set at −0.8 volts and the low logic level is set at −1.6 volts, $V_R$ would be set at −1.2 volts.

If the IN signal is greater than $V_R$, the voltage at the collector of NPN transistor 14 decreases and the voltage at the collector of NPN transistor 16 increases, since the current through current source 18 will be supplied by NPN transistor 14. Conversely, if $V_R$ is greater than the IN signal, then the voltage on the collector of NPN transistor 14 will increase and the voltage on the collector of NPN transistor 16 will decrease.

In order to increase the load which may be driven by the differential pair 12, emitter follower transistors 24 and 28 are connected to the collectors of NPN transistors 14 and 16, respectively. When the voltage on the collector of NPN transistor 14 is at a high logic state, the emitter follower 24 turns on, generating a high logic state at the COMP output. When the collector of NPN transistor 14 is at a high logic level, the collector at NPN transistor 16 is at a low logic level, thereby turning emitter follower transistor 28 off. In this instance, the TRUE output remains at a low logic state.

When the collector of NPN transistor 14 is at a low logic state and the collector of NPN transistor 16 is at a high logic state, the emitter follower transistor 24 is turned off and emitter follower transistor 28 is turned on, thereby causing the COMP output to be at a low logic state and the TRUE output to be at a high logic state.

The common-emitter mode of the ECL gate 10 has a high gain, but a relatively slow switching in comparison with the emitter follower transistors 24 and 28. In order to increase the operating speed of the gate 10, it is desirable to provide a faster switching speed on a low-to-high transition.

FIG. 2 illustrates the ECL gate 32 of the present invention. The ECL gate 32 comprises the differential pair 12 with emitter followers 24 and 28, as discussed in connection with FIG. 1, and also includes a speedup circuit 34 connected to the IN signal and the TRUE output signal. The speedup circuit 34 comprises a PNP transistor 36 having a base connected to the IN signal, a collector connected to $V_{EE}$ (or other voltage less than or equal to the low logic level voltage), and a emitter connected to ground through a resistor 38. The emitter of the PNP transistor 36 is also connected to the base of an NPN transistor 40, which has a collector connected to ground and an emitter connected to the TRUE output.

In operation, the speedup circuit 34 decreases the time delay between a transition on the IN signal from low-to-nigh and the subsequent transition on the TRUE output from low-to-high. While the input is low, the PNP transistor 36 is conducting current between its emitter and collector, and develops a charge between its base and emitter. In a high-speed circuit, the IN signal can change from a low logic state to a high logic state in 1–2 nanoseconds, which is much faster than the PNP transistor 36 can respond. As a result, the base emitter junction of the PNP transistor 36 acts as a capacitor whereby an increase in the IN signal connected to its base causes a commensurate increase in the emitter voltage. Hence, the base voltage of the NPN transistor 40 is driven high almost simultaneously with the transition of the IN signal. The NPN transistor 40 turns on quickly, and the charge stored in the base-emitter capacitor of the PNP transistor 36 discharges through the emitter of the NPN transistor 40, thus producing a high logic level at the TRUE output. The connection to ground through the NPN transistor 40 overcomes the current source 30; hence, the TRUE output remains high until the differential pair 12 and emitter followers 24 and 28 switch.

On a high-to-low transition, it is desirable that the speedup circuit 34 disengage quickly. While the PNP transistor 36 turns off slowly, it is able to turn on quickly. Since the PNP transistor 36 can turn on prior to the emitter follower 28 turning on, the speedup circuit 34 does not interfere with the operation of the ECL gate 32 during a high-to-low transition of the IN signal.

FIG. 3 illustrates how the speedup circuit 34 may increase the overall operating speed of an ECL gate. In FIG. 3, a low-to-high transition of the IN signal is illustrated by line 42. The transition of the TRUE output of the prior art ECL gate 10 is illustrated by line 44. The TRUE output using the ECL gate 32 of the present invention is illustrated by line 46. A delay measurement $DELAY_0$, is measured at a specified voltage, $V_{DREF}$. As can be seen from FIG. 3, the delay associated with the ECL circuit 32 of the present invention is significantly less than the delay associated with the prior art circuit for a low-to-high transition of the input signal. Similarly, an increase in transition for the complement output can be made using the circuit disclosed in U.S. patent application Ser. No. 302,063 (now U.S. Pat. No. 5,073,728), as represented by line relative to the transition time of the prior art ECL circuit 10, represented by line 50.

Nonetheless, the overall operating speed of the circuit must take into consideration the response of the TRUE and complement outputs to a high-to-low transition of the input signal. A high-to-low input signal is illustrated by line 52. The response of the TRUE and complement output are represented by lines 54 and 56.

The overall operating speed of the gate 32 may be increased by adjusting the threshold at which the differential gate responses to an input voltage. By slightly raising $V_R$, the ECL gate 32 will respond more quickly to a high-to-low transition of the IN signal, than to a low-to-high transition of the IN signal. While raising the threshold voltage will slightly increase the delay associated with the low-to-high transition of the gate 32, as shown by lines 58 for the TRUE output and 60 for the complement output, the delay associated with the TRUE and complement outputs of the high-to-low transition will be reduced, as shown by lines 62 and 64. By adjusting $V_R$, a delay illustrated as $DELAY_1$ can be obtained such that the circuit responds with equal speed to both high-to-low and low-to-high transitions of the IN signal.

It should be noted that while FIG. 2 is illustrated for a simple ECL gate 32, more complex gates could be designed using the speedup circuit 34.

In addition to providing a faster operating speed for the gate, the speedup circuit 34 allows a larger load to be driven by the TRUE output. Tests have shown that the speedup circuit 34 may drive in excess of 66 transistors.

Although the present invention has been described in detail, it should be understood that various changes, substitutions and alterations can be made herein without departing from the spirit and scope of the invention as defined by the appended claims.

What is claimed is:

1. An emitter coupled logic gate having a fast operating speed, comprising:
    an input node receiving an input signal;
    circuitry for generating a reference voltage;
    a differential transistor pair comprising first and second transistors each having a base, an emitter and a collector, the base of said first transistor coupled to said input node and driven by said input signal and the base of said second transistor driven by a reference voltage such that said first transistor conducts responsive to said input signal being greater than said reference voltage and said second transistor conducts responsive to said reference voltage being greater than said input signal;
    a PNP transistor having a base, an emitter and a collector, the base of said PNP transistor driven by said input signal such that the voltage on the emitter of the PNP transistor will rise in response to a fast transition of said input signal from a low logic level to a high logic level;
    an output node; and
    a third transistor having a base coupled to the emitter of said PNP transistor, an emitter coupled to said output node, and a collector coupled to a predetermined voltage greater than or equal to the voltage of the high logic level such that said predetermined voltage is applied to said output node responsive to the voltage rise of the emitter of the PNP transistor when the input signal transitions from a low logic level to a high logic level.

2. The gate of claim 1 wherein said first, second and third transistors comprise NPN transistors.

3. The gate of claim 1 wherein said output node comprises a first output node, said gate further including a second output node coupled to said differential transistor pair such that the complement of said input signal is generated on said second output node.

4. The gate of claim 1 wherein said output node is coupled to said differential pair.

5. The gate of claim 4 wherein said output node is coupled to the collector of said second transistor.

6. The gate of claim 3 and further including a fourth transistor having a base operatively coupled to said input node, a collector coupled to said predetermined voltage and an emitter coupled to said second output node to increase the transition speed of the complement signal responsive to a transition from a low logic state to a high logic state of input signal.

7. A method of providing a fast output transition from a low logic state to a high logic state on an output node of an ECL gate responsive to an input transition from a low logic state to a high logic state, comprising the steps of:
    storing a charge in a capacitive element having a first and second nodes while the input is at a low logic state;
    increasing the voltage at a first node of the capacitive element responsive to an increase of the voltage of the input such that the voltage at the second node of the capacitive element is similarly increased; and
    generating a high logic state at the output responsive to an increase in voltage at said second node by coupling a base on a NPN transistor to said second node and coupling an emitter of said NPN transistor to said output.

8. The method of claim 7 wherein said step of storing a charge in a capacitive element comprises the step of storing a charge in the base emitter junction of a PNP transistor.

9. A circuit for providing a fast output transition from a low logic state to a high logic state responsive to an input transition from a low logic state to a high logic state, comprising:
    a differential gate circuit having an input, a first output and a second output, the first output following a voltage value at the input and the second output following a complement voltage value at the input, the differential gate circuit also connected to a first voltage source and a second voltage source, the second voltage source being smaller in value than the first voltage source; and
    a speedup circuit connected to the input of the differential gate circuit, the first output of the differential gate circuit, the first voltage source, and the second voltage source, wherein the speedup circuit is operable to decrease the propagation delay between the input voltage value and the first output voltage value of the differential gate circuit by charging up a voltage while the circuit input is at a low logic state such that when the input transitions to a high logic state the speedup circuit quickly produces a high logic state on the circuit output.

10. The circuit of claim 9 wherein the speedup circuit comprises:
    a capacitive element connected between the input of the differential gate circuit and the first voltage source; and
    a switching element having a first terminal connected to the first voltage source, a second terminal connected to the first output of the differential gate circuit and a control terminal connected to the capacitive element, wherein the capacitive element is operable to quickly charge when the input of the differential gate circuit transitions from a low logic state to a high logic state thereby activating the switching element via the control terminal and causing the output of the differential gate circuit, coupled to switching element through the second terminal, to quickly transition from a low logic state to a high logic state thus following the voltage at the input of the differential gate circuit.

11. The circuit of claim 10 wherein the capacitive element comprises a base emitter junction of a bipolar transistor, the emitter terminal connected to the control terminal of the switching element and the base terminal connected to the input of the differential gate circuit.

12. The circuit of claim 10 wherein the switching element comprises an NPN transistor, the collector terminal being the first terminal, the emitter being the second terminal, and the base terminal being the control terminal.

13. The circuit of claim 12 wherein a resistor is coupled between the base terminal and collector terminal of the NPN transistor.

14. The circuit of claim 9 wherein the speedup circuit comprises:
- a PNP transistor with an emitter terminal, a base terminal connected to the input of the differential gate circuit, and a collector terminal connected to the second voltage source;
- a resistor connected between the emitter terminal of the PNP transistor and the first voltage source; and
- an NPN transistor with a collector terminal connected to the first voltage source, a base terminal connected to the emitter terminal of the PNP transistor, and a collector terminal connected to the first output of the differential gate circuit.

15. A differential circuit having an input and an output, the output voltage level following the voltage level of the input, the differential circuit providing a decreased propagation delay between the input and output when the input transitions from a low logic level to a high logic level, comprising:
- a first NPN transistor having a collector terminal, a base terminal forming the input of the circuit, and an emitter terminal;
- a second NPN transistor having a collector terminal, a base terminal connected to a reference voltage, and an emitter terminal connected to the emitter terminal of the first NPN transistor, the first and second NPN transistors forming a differential pair;
- a first resistor connected between the collector of the first NPN transistor and a first voltage source;
- a second resistor connected between the collector of the second NPN transistor and the first voltage source;
- a first constant current source connected between the emitters of both the first and second NPN transistors and a second voltage source, the second voltage source being less in value than the first voltage source;
- a third NPN transistor having a collector connected to the first voltage source, a base terminal connected to the collector of the first NPN transistor, and an emitter terminal;
- a second current source connected between the emitter of the third NPN transistor and the second voltage source;
- a fourth NPN transistor having a collector connected to the first voltage source, a base terminal connected to the collector of the second NPN terminal, and an emitter terminal;
- a third current source connected between the emitter of the fourth NPN transistor and the second voltage source;
- a PNP transistor having a collector terminal connected to the second voltage source, a base terminal connected to the base terminal of the first NPN transistor, and an emitter terminal;
- a third resistor connected between the emitter of the PNP transistor and the first voltage source; and
- a fifth NPN transistor having a collector terminal connected to the first voltage source, a base terminal connected to the emitter of the PNP transistor, and an emitter connected to the emitter of the fourth NPN transistor, the emitter of the fifth transistor forming the circuit output.

* * * * *